United States Patent [19]

Cheng

[11] Patent Number: 5,767,594
[45] Date of Patent: Jun. 16, 1998

[54] COMPUTER KEYBOARD POWER SAVING METHOD

[75] Inventor: Andrew Cheng, Hsinchu, Taiwan

[73] Assignee: Holtek Microelectronics, Inc., Hsinchu, Taiwan

[21] Appl. No.: 554,490

[22] Filed: Nov. 7, 1995

[51] Int. Cl.$^6$ ................................................ H01H 47/00
[52] U.S. Cl. ........................ 307/125; 307/116; 307/126; 307/139; 307/140
[58] Field of Search ...................... 84/621, 691; 307/116, 307/125, 126, 139, 140, 147, 154, 141, 141.4; 364/707; 395/750

[56] References Cited

U.S. PATENT DOCUMENTS

| | | |
|---|---|---|
| 3,866,543 | 2/1975 | Marin ........................... 340/365 |
| 5,461,266 | 10/1995 | Koreeda et al. .................. 307/125 |
| 5,486,726 | 1/1996 | Kim et al. ...................... 307/120 |
| 5,539,400 | 7/1996 | Mears ........................... 341/22 |

Primary Examiner—Richard T. Elms
Assistant Examiner—Kim Lockett
Attorney, Agent, or Firm—W. Wayne Liauh

[57] ABSTRACT

A computer keyboard power saving method includes sensing if there is keystroke action taking place. When time period of no keystroke action exceeds a pre-set threshold, power supply to the keyboard will be shut down automatically. When a keystroke action is detected, power supply to the keyboard will be resumed instantly. Thus can save energy when keyboard is idle from time to time.

2 Claims, 3 Drawing Sheets

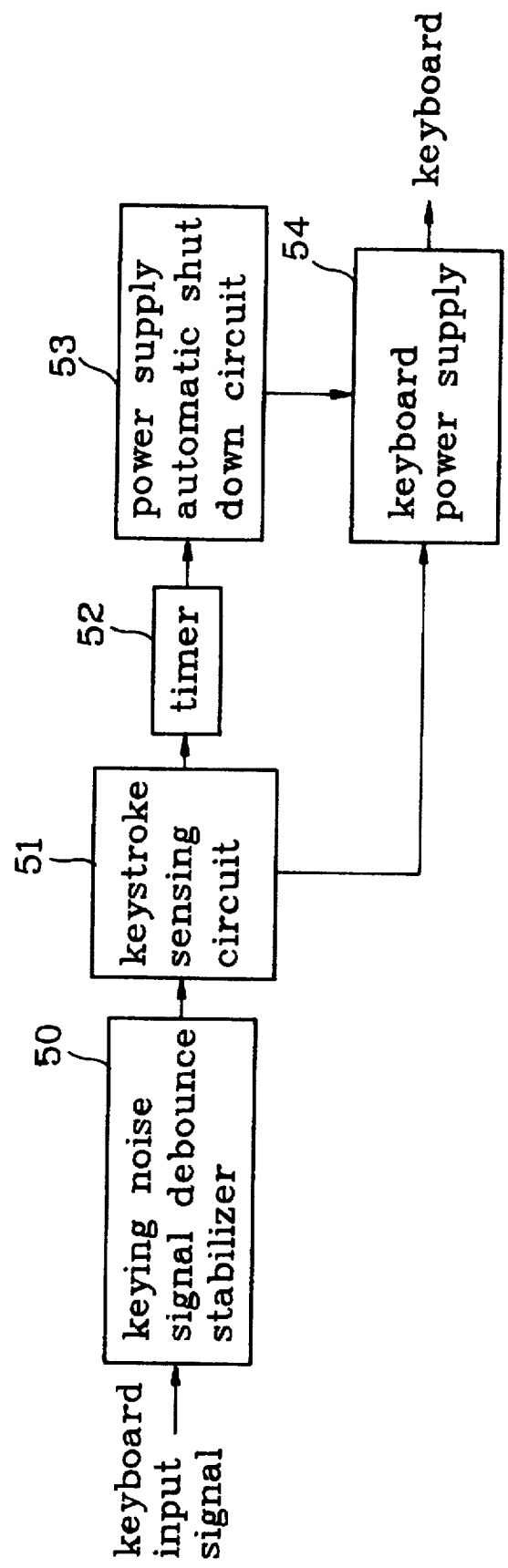
F I G.2

COMPUTER KEYBOARD POWER SAVING METHOD

BACKGROUND OF THE INVENTION

A conventional computer keyboard continuously consumes electric power once the computer is turned on, whether there is keystroke action on the keyboard or not. It is a waste of energy that needs improvement.

SUMMARY OF THE INVENTION

The primary object of the present invention is to provide a method and electric circuit for reducing power consumption of the is computer keyboard thus to save the energy. The present invention provides a means to continuously detect if a keyboard is idle or active. When the keyboard is idle, the power supply to the keyboard is shutdown to reduce power consumption. When the keyboard is active, the power supply is resumed at normal operation mode, thereby to save total energy for using a computer.

BRIEF DESCRIPTION OF THE DRAWING

FIG. 2 is an electric circuit diagram of an embodiment of the present invention.

DETAILED DESCRIPTION

Figure 1:
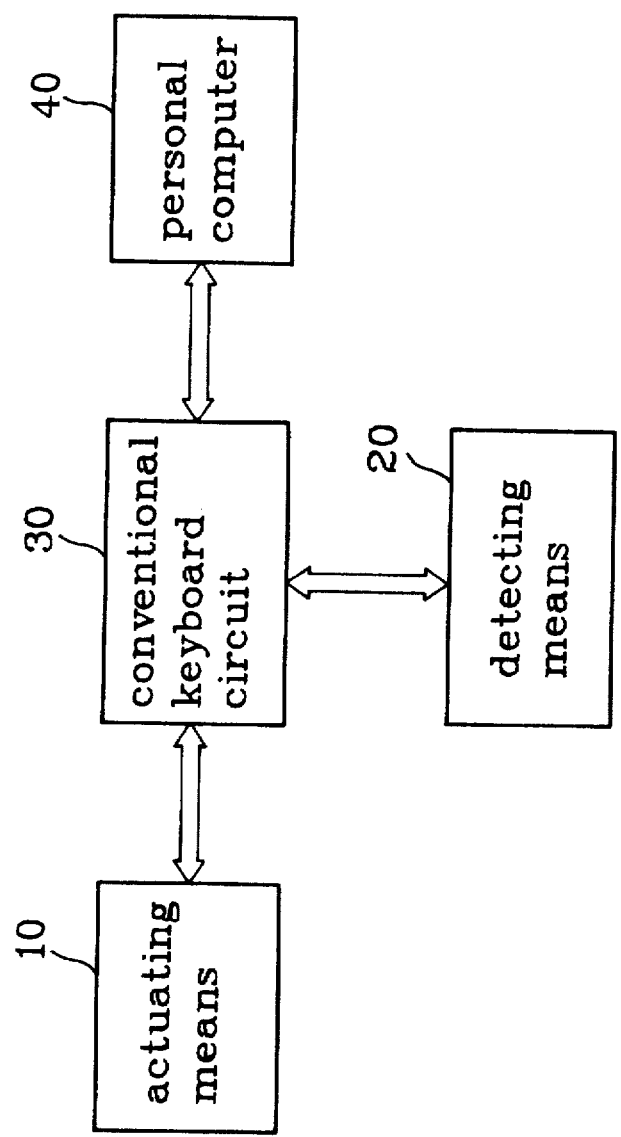
FIG. 1 is a schematic operational diagram of an embodiment of the present invention.

Referring to FIG. 1 for the operational diagram of an embodiment of the present invention, in an conventional keyboard circuit (30) there is provided an actuating means (10) which would shut down power supply when it detects the idle time of the keyboard exceeding a preset threshold and a detecting means (20) to sense the keystroke motion. The actuating means constantly sense if there is a keystroke movement. When there is no keystroke movement for a pre-set time interval, the power supply to keyboard is shut down. When a keystroke movement is sensed, lo the power supply is resumed for normal operation. The keyboard circuit (30) connects with a personal computer (40) to accept key-in operation. To shut down power supply means to turn off oscillator and other circuit which might cause power consumption in the keyboard.

FIG. 2 illustrates an electric circuit diagram of the present invention which includes a keying noise signal debounce stabilizer (50), a keystroke sensing circuit (51), a timer (52), a power supply automatic shut down circuit (53) and a keyboard power supply (54). The keying noise signal debounce stabilizer (50) receives the input signal from the keyboard and eliminate the noise signal associated with keystroke, then transmits the input signal to the keystroke sensing circuit (51) which detects if a keystroke taking place, and output a signal of keystroke from the keystroke sensing circuit (51) to reset the timer (52). When there is no input signal of keystroke from the keystroke sensing circuit (51) for a pre-set time interval, the timer (52) triggers power supply automatic shut down circuit (53) to shut down power supply (54) to the keyboard. The keystroke sensing circuit (51) sends a signal to the power supply (54), once a keystroke signal is detected. Thereupon the power supply (54) is resumed instantly.

Figure 3:
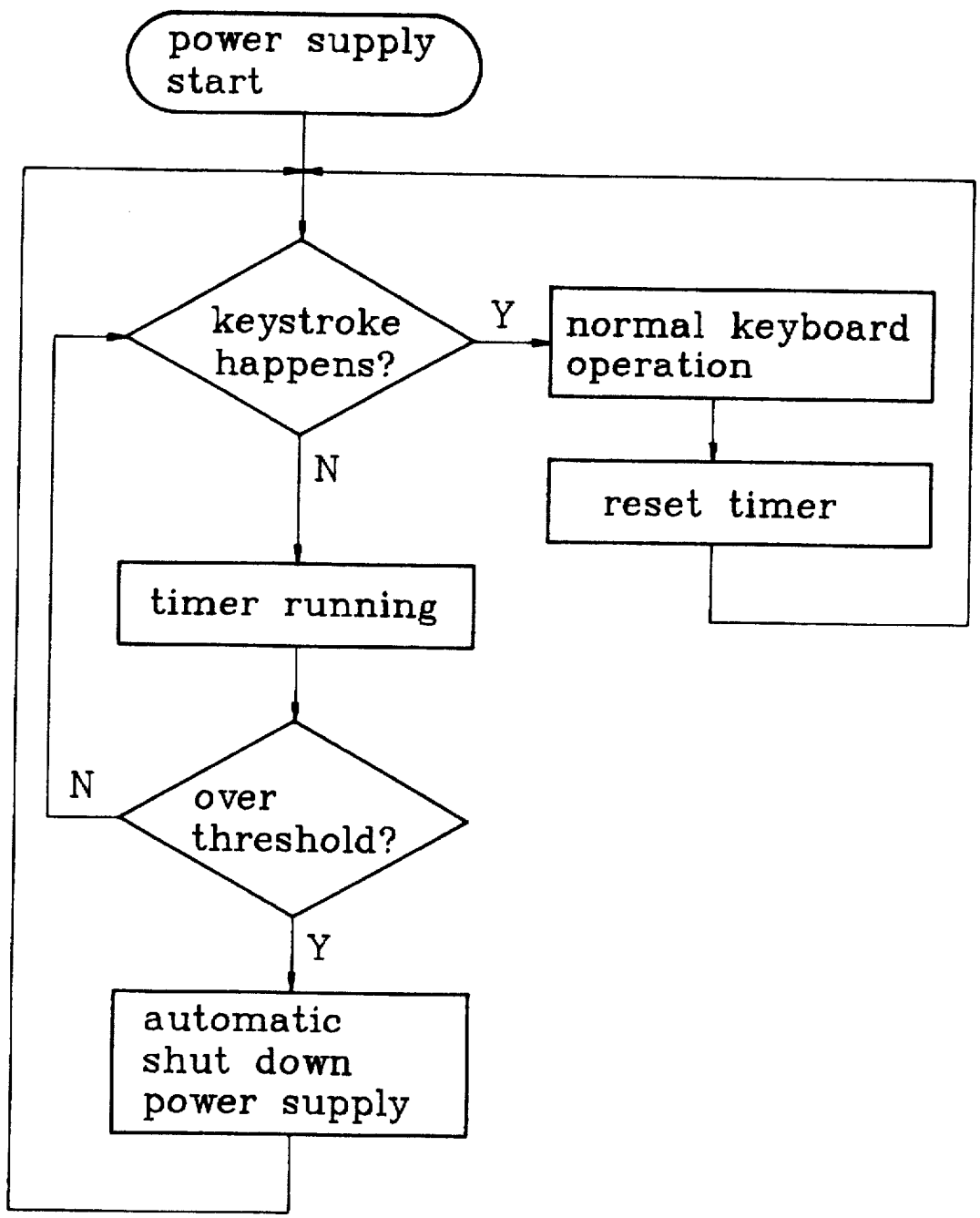
FIG. 3 is an operational flow chart of an embodiment of the present invention.

FIG. 3 is an operational flow chart of the present invention. It is to describe that the keyboard is detected no keystroke signal over a pre-set time interval, then let the keyboard shut down. That is to turn off oscillator and other circuit which might cause power consumption in the keyboard. If there is a keystroke movement to resume the power supply. From the beginning is to turn on the power supply, then the first step is to detect whether there is a keystroke movement or not and the timer is counting. If there is the keystroke movement to perform normal keyboard operation, then reset the timer to zero and goes back to the beginning. The power supply to the keyboard is automatically shut down, if there is no keystroke movement detected still, the timer is counting until the counting time exceeds a pre-set threshold. The power supply is resumed when a keystroke movement is detected: that is to go back to the beginning.

I claim:

1. A computer keyboard power saving method for saving power supplied to a keyboard including the steps of:

(a) providing a keyboard power saving circuit which contains a keystroke sensing circuit, a power supply automatic shut down circuit and a keyboard power supply circuit, wherein said keystroke sensing circuit is connected to both said power supply automatic shutdown circuit and said keyboard power supply circuit, and said power supply automatic shut-down circuit and said keyboard power supply circuit are connected to each other;

(b) supplying power to said keystroke sensing circuit which is then routed separately to said power supply automatic shut down circuit and said keyboard power supply circuit;

(c) using said keystroke sensing circuit to constantly sense if a keystroke action takes place from a keyboard, (d) using a said keyboard power supply circuit to allow power supply to be supplied to said keyboard when a time interval, measured using a timer, between two consecutive said keystroke actions is less than a pre-set threshold;

(e) resetting said timer to zero when a new keystroke action is sensed, (f) using said power supply automatic shut down circuit to stop power supply to said keyboard when no keystroke action is sensed over a pre-set threshold, while allowing said keystroke sensing circuit to-constantly sense keystroke actions as described in step (c).

2. A computer keyboard power saving apparatus comprising:

a keying noise signal debounce stabilizer for eliminating noise signal associated with a keystroke;

a keystroke sensing circuit connected with said keying noise signal debounce stabilizer for receiving keyboard input signal therefrom;

a timer connected with said keystroke sensing circuit for measuring an idle time of said keystroke;

a power supply automatic shut down circuit connected with said timer for shutting down power supply to said keyboard when said idle time measured by said timer exceeds a pre-set threshold; and a keyboard power supply circuit, which is connected to said keystroke sensing circuit for providing power supply to said keyboard when said keystroke is sensed, and to said power supply automatic shut down circuit for shutting down power supply to said keyboard when said idle time exceeding said pre-set threshold;

wherein said keystroke sensing circuit is connected to both said power supply automatic shut down circuit and said keyboard power supply circuit to supply power separately thereto so that said keystroke sensing circuit is able to continue receiving the keyboard input signal even when the power supply to said keyboard is shut down.

* * * * *